(12) United States Patent
McCall et al.

(10) Patent No.: US 11,074,959 B2
(45) Date of Patent: *Jul. 27, 2021

(54) DDR MEMORY BUS WITH A REDUCED DATA STROBE SIGNAL PREAMBLE TIMESPAN

(71) Applicant: Intel Corporation, Santa Clara, CA (US)

(72) Inventors: James A. McCall, Portland, OR (US); Christopher P. Mozak, Portland, OR (US); Christopher E. Cox, Placerville, CA (US); Yan Fu, Portland, OR (US); Robert J. Friar, Portland, OR (US); Hsien-Pao Yang, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/741,368

(22) Filed: Jan. 13, 2020

(65) Prior Publication Data

US 2020/0286543 A1 Sep. 10, 2020

Related U.S. Application Data

(63) Continuation of application No. 15/716,485, filed on Sep. 26, 2017, now Pat. No. 10,541,018.

(51) Int. Cl.
*G11C 11/40* (2006.01)
*G11C 11/4072* (2006.01)
(Continued)

(52) U.S. Cl.
CPC ........ *G11C 11/4072* (2013.01); *G06F 3/0604* (2013.01); *G06F 3/0632* (2013.01); *G06F 3/0673* (2013.01); *G06F 13/1689* (2013.01); *G11C 7/1054* (2013.01); *G11C 7/1066* (2013.01); *G11C 7/1084* (2013.01); *G11C 7/1093* (2013.01); *G11C 11/4076* (2013.01); *G11C 11/4093* (2013.01)

(58) Field of Classification Search
CPC .............. G11C 11/4072; G06F 3/0604; G06F 3/0673; G06F 3/0632
See application file for complete search history.

(56) References Cited

U.S. PATENT DOCUMENTS 6,771,515 B2  8/2004  McCall et al.
7,010,637 B2  3/2006  To et al.
(Continued)

OTHER PUBLICATIONS

Starting on p. 4, paragraphs [0011] through paragraph [0034] only of U.S. Appl. No. 15/716,485, filed Sep. 26, 2017, pp. 4-12.

*Primary Examiner* — Mohammed A Bashar
(74) *Attorney, Agent, or Firm* — Compass IP Law PC (57) ABSTRACT

A method is described. The method includes configuring first register space to establish ODT values of a data strobe signal trace of a DDR data bus. The method also includes configuring second register space to establish ODT values of a data signal trace of the DDR data bus. The ODT values for the data strobe signal trace are different than the ODT values for the data signal trace. The ODT values for the data strobe signal do not change when consecutive write operations of the DDR bus write to different ranks of a same DIMM.

17 Claims, 11 Drawing Sheets

(51) Int. Cl.
*G06F 3/06* (2006.01)
*G11C 7/10* (2006.01)
*G11C 11/4093* (2006.01)
*G11C 11/4076* (2006.01)
*G06F 13/16* (2006.01)

(56) References Cited

U.S. PATENT DOCUMENTS

| | | | |
|---|---|---|---|
| 8,274,850 B2 * | 9/2012 | Koshizuka | G11C 5/04 326/30 |
| 10,033,382 B2 | 7/2018 | McCall et al. | |
| 2014/0192583 A1 | 7/2014 | Rajan et al. | |
| 2015/0279444 A1 | 10/2015 | Vergis et al. | |
| 2016/0087630 A1 | 3/2016 | Park et al. | |
| 2017/0255412 A1 | 9/2017 | Cox et al. | |
| 2017/0364469 A1 * | 12/2017 | Crisp | G11C 11/4096 |

* cited by examiner

/DQS, DQS and DQ ODT Memory Write Settings

321

| | CPU ODT | DIMM1 ODT | | DIMM0 ODT | |
| --- | --- | --- | --- | --- | --- |
| | | RNK0 | RNK1 | RNK0 | RNK1 |
| WRITE 1 RNK0 | N/A | 240 | 60 | 60 | 60 |
| WRITE 1 RNK1 | N/A | 60 | 240 | 60 | 60 |
| WRITE 0 RNK0 | N/A | 60 | 60 | 240 | 60 |
| WRITE 0 RNK1 | N/A | 60 | 60 | 60 | 240 |

/DQS, DQS and DQ ODT Memory Read Settings

322

| | CPU ODT | DIMM1 ODT | | DIMM0 ODT | |
| --- | --- | --- | --- | --- | --- |
| | | RNK0 | RNK1 | RNK0 | RNK1 |
| READ 1 RNK0 | 50 | N/A | 240 | 60 | 60 |
| READ 1 RNK1 | 50 | 240 | N/A | 60 | 60 |
| READ 0 RNK0 | 50 | 60 | 60 | N/A | 240 |
| READ 0 RNK1 | 50 | 60 | 60 | 240 | N/A |

DQ ODT Memory Write Settings

| | CPU ODT | DIMM1 ODT | | DIMM0 ODT | |
| --- | --- | --- | --- | --- | --- |
| | | RNK0 | RNK1 | RNK0 | RNK1 |
| WRITE 1 RNK0 | N/A | 240 | 60 | 60 | 60 |
| WRITE 1 RNK1 | N/A | 60 | 240 | 60 | 60 |
| WRITE 0 RNK0 | N/A | 60 | 60 | 240 | 60 |
| WRITE 0 RNK1 | N/A | 60 | 60 | 60 | 240 |

DQ ODT Memory Read Settings

| | CPU ODT | DIMM1 ODT | | DIMM0 ODT | |
| --- | --- | --- | --- | --- | --- |
| | | RNK0 | RNK1 | RNK0 | RNK1 |
| READ 1 RNK0 | 50 | N/A | 240 | 60 | 60 |
| READ 1 RNK1 | 50 | 240 | N/A | 60 | 60 |
| READ 0 RNK0 | 50 | 60 | 60 | N/A | 240 |
| READ 0 RNK1 | 50 | 60 | 60 | 240 | N/A |

DQS, /DQS ODT Memory Write Settings

| | CPU ODT | DIMM1 ODT | | DIMM0 ODT | |
|---|---|---|---|---|---|
| | | RNK0 | RNK1 | RNK0 | RNK1 |
| WRITE 1 RNK0 | N/A | 120 | 120 | 80 | 80 |
| WRITE 1 RNK1 | N/A | 120 | 120 | 80 | 80 |
| WRITE 0 RNK0 | N/A | 120 | 120 | 80 | 80 |
| WRITE 0 RNK1 | N/A | 120 | 120 | 80 | 80 |

523

DQS, /DQS ODT Memory Read Settings

| | CPU ODT | DIMM1 ODT | | DIMM0 ODT | |
|---|---|---|---|---|---|
| | | RNK0 | RNK1 | RNK0 | RNK1 |
| READ 1 RNK0 | 50 | N/A | 120 | 80 | 80 |
| READ 1 RNK1 | 50 | 120 | N/A | 80 | 80 |
| READ 0 RNK0 | 50 | 120 | 120 | N/A | 80 |
| READ 0 RNK1 | 50 | 120 | 120 | 80 | N/A |

DDR MEMORY BUS WITH A REDUCED DATA STROBE SIGNAL PREAMBLE TIMESPAN

RELATED CASES

This application is a continuation of and claims the benefit of U.S. patent application Ser. No. 15/716,485, entitled, "DDR MEMORY BUS WITH A REDUCED DATA STROBE SIGNAL PREAMBLE TIMESPAN", filed Sep. 26, 2017, which is incorporated by reference in its entirety.

FIELD OF INVENTION

The field of invention pertains generally to the computing sciences, and, more specifically, to a DDR memory bus with a reduced data strobe signal preamble timespan.

BACKGROUND

Computing system designers are highly motivated to increase the overall performance of the computing systems they design. Because system memory (also referred to as "main memory") is a critical component within a computing system, improvements in system memory performance generally result directly in overall computing system performance. As such, computing system designers tend to put emphasis on finding new ways to improve system memory performance.

FIGURES

A better understanding of the present invention can be obtained from the following detailed description in conjunction with the following drawings, in which.

DETAILED DESCRIPTION

Figure 1:
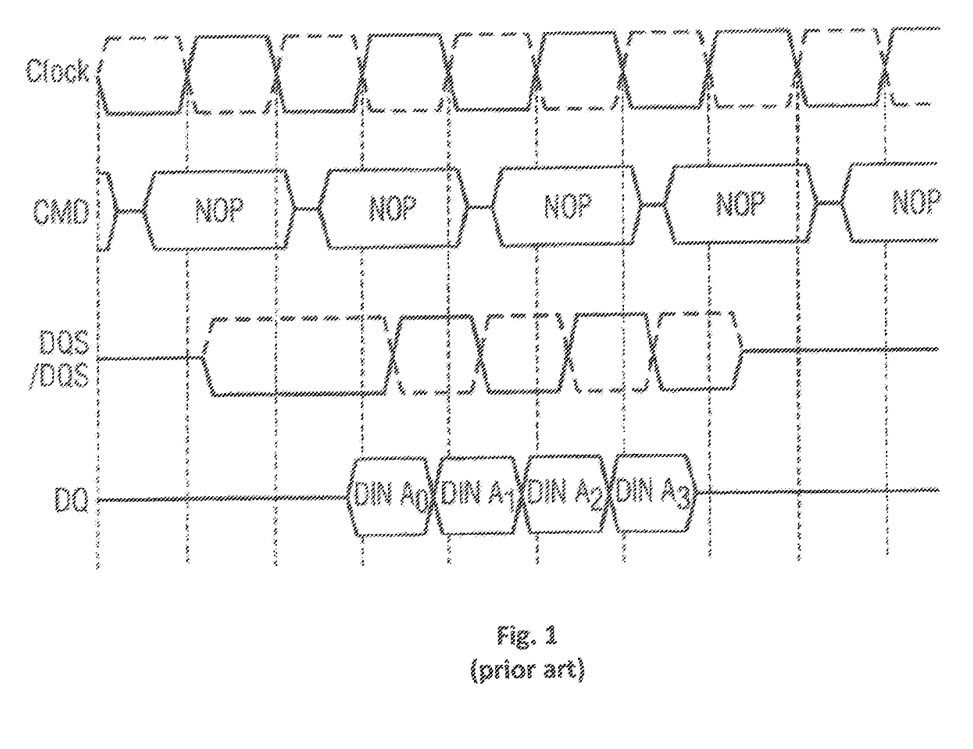
FIG. 1 shows DDR data bus signals (prior art)

FIG. 1 shows a basic depiction of a transfer of date over a double data rate (DDR) data bus. DDR data bus technology is particularly prevalent as the communication technology that is inserted between the host side main memory controller of a computing system and the computing system's main memory. For instance, the Joint Electron Device Engineering Council (JEDEC) publishes DDR data bus standards (e.g., DDR3, DDR4, etc.) that have received wide adoption in the computer industry as the interface standard that memory controller designers and memory chip suppliers design their circuits to conform to.

The exemplary DDR data bus of FIG. 1 includes various signal traces (also referred to as "nets") including a command signal trace (CMD), data queue strobe signal traces (DQS and /DQS) and multiple data queue signal traces (DQ). The bus transfers data (DIN) over the DQ traces in multiple bursts where the data of each burst has different associated memory address information A0, A1, A2, A3. The DIN data is transferred synchronously with a pair of data strobe signals (DQS and /DQS) that together form a differential strobe signal (where DQS corresponds to the positive end of the differential signal and /DQS corresponds to the negative end of the differential signal).

Here, the data transfer of FIG. 1 can be viewed, e.g., as either a memory write process in which a memory controller is transferring write data over the DDR bus to a memory, or, a memory read process in which a memory is transferring read data over the DDR bus to a memory controller. The particular DDR transfer of FIG. 1 can be viewed as a "source synchronous" data transfer in the sense that the memory controller provides the DQS strobe signals in the case of a memory write, and, the memory device provides the DQS strobe signals in the case of a memory read.

As can be seen in FIG. 1, the DIN data is transferred over the DQ traces on both the rising and falling edges of the DQS strobe (hence the term, "double date rate" as logical data transfers traditionally transfer data on only a rising edge or a falling edge of a clock/strobe). In order to effect a DDR transfer, data is sampled from the DQ traces by the receiving end each time the DQS strobe signal transitions between a logic high (e.g., when DQS is greater than/DQS) and a logic low (e.g., when/DQS is greater than DQS).

Even higher bandwidth transfers may be effected by using higher fundamental clock frequencies in combination with a double data rate approach. That is, for instance, simplistically viewing the DQS strobe of FIG. 1 as a clock signal, more data can be transferred per unit time the higher the DQS strobe's fundamental frequency (e.g., approximately twice as much data can be transferred with a 4 GHz DQS strobe than a 2 GHz strobe). As such, system designers strive to not only implement DDR data transfers between the host and memory but also to implement the DDR transfers with high fundamental clock frequencies.

A problem is that higher fundamental clock frequencies are more prone to various forms of signal distortion. A primary distortion of concern is the existence of signal reflections of the bus traces resulting from improperly terminated signal lines. As such, JEDEC has promulgated DDR standards (starting with DDR3) that specify the inclusion of on-die termination (ODT) circuitry for the DQS strobe and DQ data signal traces.

Figure 2A:
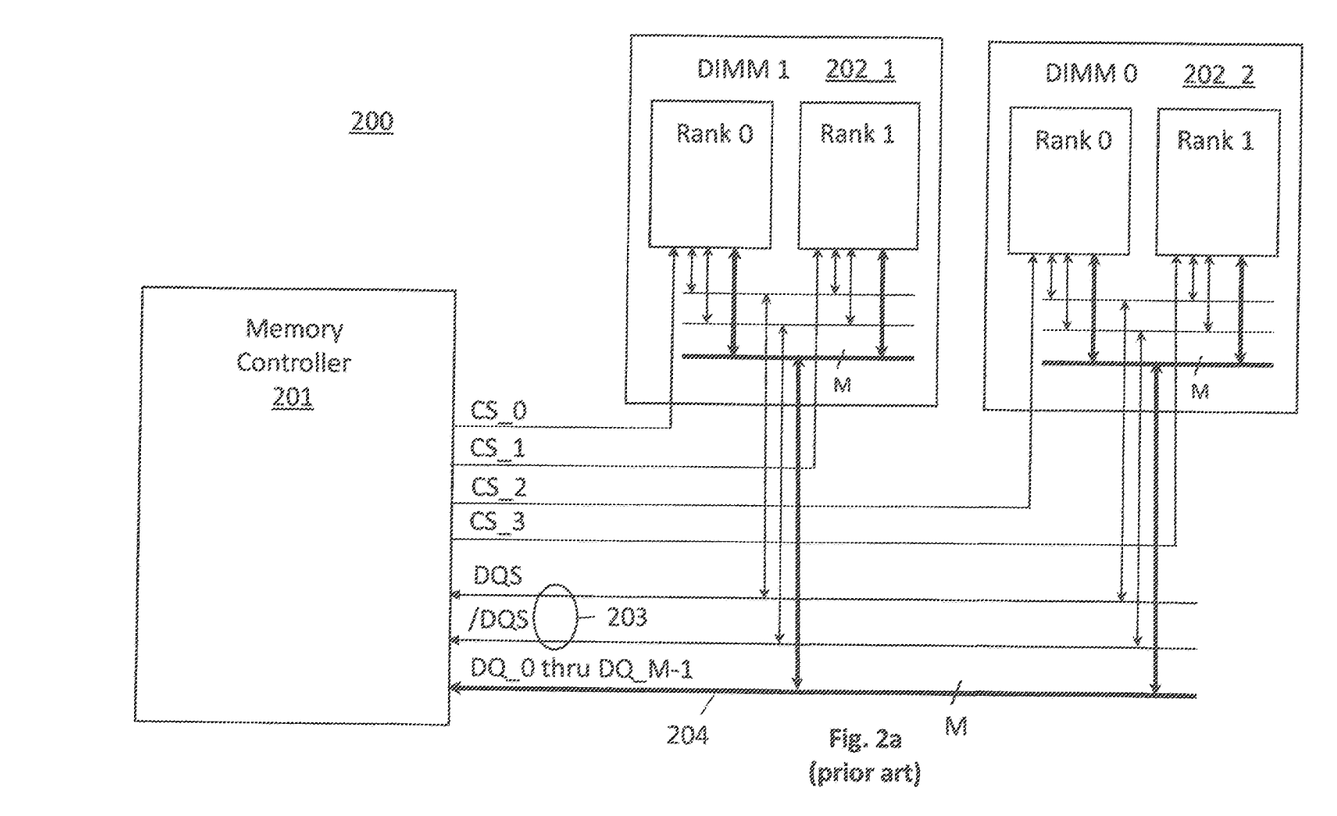
FIGS. 2a and 2b show different circuitry of a DDR data bus (prior art)

FIG. 2a depicts a memory system 200 that includes a memory controller 201 and a pair of memory modules 201_1, 201_2. As can be seen in FIG. 2a, the data bus has a "width" of M bits as there are M DQ signal traces. Additionally, each of the individual DQS 203 and DQ 204 signal lines are bi-directional (each DQS and DQ signal trace is coupled to both a transmitter and a receiver on the memory controller side and on each memory module rank side).

Figure 2B:
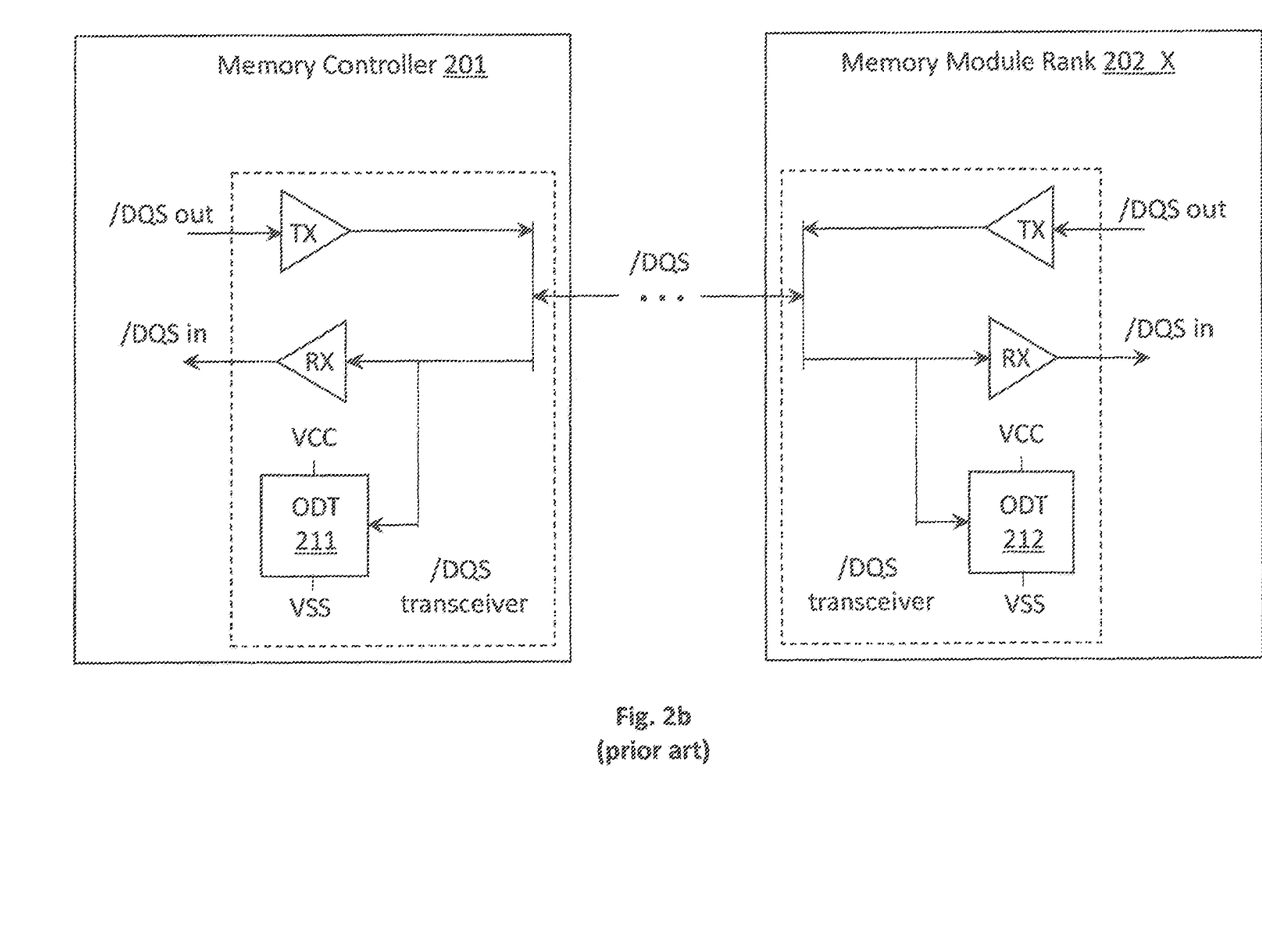

FIG. 2b depicts a single trace (the /DQS trace) in more detail so that the bi-directional nature of the DQS, /DQS and each of the M DQ traces can be better comprehended. The bi-directional implementation of the traces is consistent with the source synchronous nature of the DDS bus in that, during a memory write, the respective transmitter for the /DQS trace on the memory controller 201 side is enabled while the respective receiver for the /DQS trace of at least the targeted memory module rank 202_X are enabled. Likewise, during a memory read, the respective transmitter for the /DQS trace of at least the memory module rank side being read from 202_X is enabled while the respective receiver for the /DQS on the memory controller side 201 is enabled.

As such, since ODT circuitry 211, 212 is intended to better terminate signal traces on the receiving end (to diminish signal distortions caused by reflections on the receiving end). Here, during a memory write, ODT circuitry 211 on the memory controller side 201 is disabled (or is in a high impedance state) while ODT circuitry 212 on the targeted memory module rank side 202_X is enabled. Likewise, during a memory read, ODT circuitry 212 is disabled on the side of the memory module rank being read from 202_X while ODT circuitry 211 is enabled on the memory controller side 201. Here, it is again pertinent to recognize that each of the DQS, /DQS and all M DQ traces of FIG. 2a are individually designed as depicted in FIG. 2a but with three additional memory module ranks side 202_X (four total) because each of these traces is coupled to four ranks.

According to one embodiment, ODT circuitry 211, 212 is implemented with a precision termination resistance value Zo, where, the trace's termination resistance is configurable as Zo/N and N can be any of values, e.g., 1, 2, 4 or 8. For example, if the precision termination resistance value is 240 ohms, the termination resistance that can be established by an ODT circuit can be any of 240, 120, 60 or 30 ohms. Here, N may be specified by way of configuration register space within both the memory controller 201 and memory modules 202_1, 202_2. In order to effect the configurable termination resistance, the ODT circuitry 211, 212 may be implemented, e.g., as a resistive divider network that includes first resistance between the signal line being terminated by the divider network and VCC, and, second resistance between the signal line being terminated and a reference such as VSS or ground, where, either or both of the first and second resistances can be adjusted to effect a specific Zo/N termination resistance for the overall divider network.

Those of ordinary skill will appreciate that FIG. 2a represents a common main memory implementation in which both memory modules 201_1, 202_2 corresponds to a dual-in-line memory module (DIMM). That is, many computing systems currently implement their main memory with a DDR memory bus that is coupled to a main memory controller 201 and first and second DIMMs 201_1, 201_2 that are connected to the DDR memory bus.

Those of ordinary skill will also appreciate that DIMMs often include more than one (e.g., two) ranks of memory chips. For example, a DIMM may be designed to include a first rank (rank 0) of memory chips on a first side of the DIMM and a second rank (rank 1) of memory chips on a second, opposite side of the DIMM. In various embodiments, a rank is a set of memory chips that are coupled to a same chip select (CS) signal. Thus, whereas FIG. 2a depicts the DQS and DQ signals as being multi-drop signals in that all four ranks associated with both DIMMs are coupled to the same DQS and DQ signal traces, by contrast, each of the four ranks is coupled to its own unique CS signal line (specifically, rank 0 of DIMM_1 is coupled to CS_0, rank 1 of DIMM_1 is coupled to CS_1, rank 0 of DIMM_0 is coupled to CS_2 and rank 1 of DIMM_0 is coupled to CS_3).

Each rank is viewed as its own set of addressable memory space and the memory controller 201 writes into a particular rank/set by activating the chip select of that rank/set. Thus, for example, if the memory controller 201 desires to write/read into/from rank 0 of DIMM_1 202_1 it will activate CS_0 but deactivate CS_1, CS_2 and CS_3 on the DDR data bus. Likewise, if the memory controller 201 desires to write/read into/from rank 1 of DIMM_1 201_1 it will activate CS_1 but deactivate CS_0, CS_2 and CS_3 of the DDR data bus. Analogous operations are performed if the memory controller desires to write/read to/from ranks 0 or 1 of DIMM_0 202_2.

Here, each rank includes enough memory chips to implement a data bus width of a specific width (M). For instance, in the case of a 64 bit data bus width, each rank will include, e.g., eight 8 bit memory chips or four 16 bit memory chips (as just two examples). In this manner, memory resources are easily expandable while at the same time keeping the memory data bus width constant across each memory partition (e.g., each unique CS that stems from the memory controller 201 and is coupled to an actual physical rank of memory space corresponds to a higher ordered bit of the computing system's addressable main memory space).

In various approaches the ODT termination resistance values of the memory controller and the ranks that are coupled to a same memory bus will change depending on how the memory controller 201 is using the individual ranks. Moreover, according to prior art approaches, the ODT settings and the manner in which they changed are identical for both the DQS, /DQS and DQ signals.

Figure 3A:
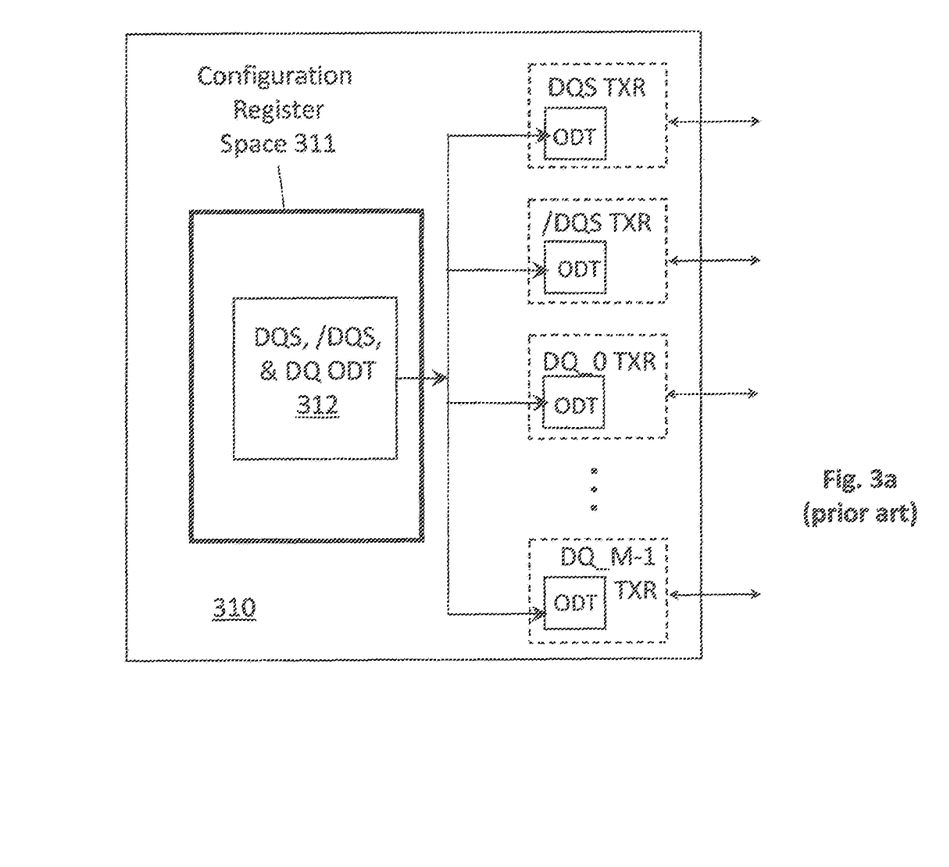
FIGS. 3a and 3b show ODT configuration circuitry and ODT configuration settings (prior art)

FIG. 3a depicts the prior art design approach for both the memory controller and the memory chips. As observed in FIG. 3a, according to the prior art approach, a single ODT configuration setting 312 in configuration register space 311 determined the ODT values for each of the DQS, /DQS and DQ signal traces. That is, ODT settings for each of the DQS, /DQS and DQ signal traces were identical within a particular memory controller or memory chip 310.

Figure 3B:
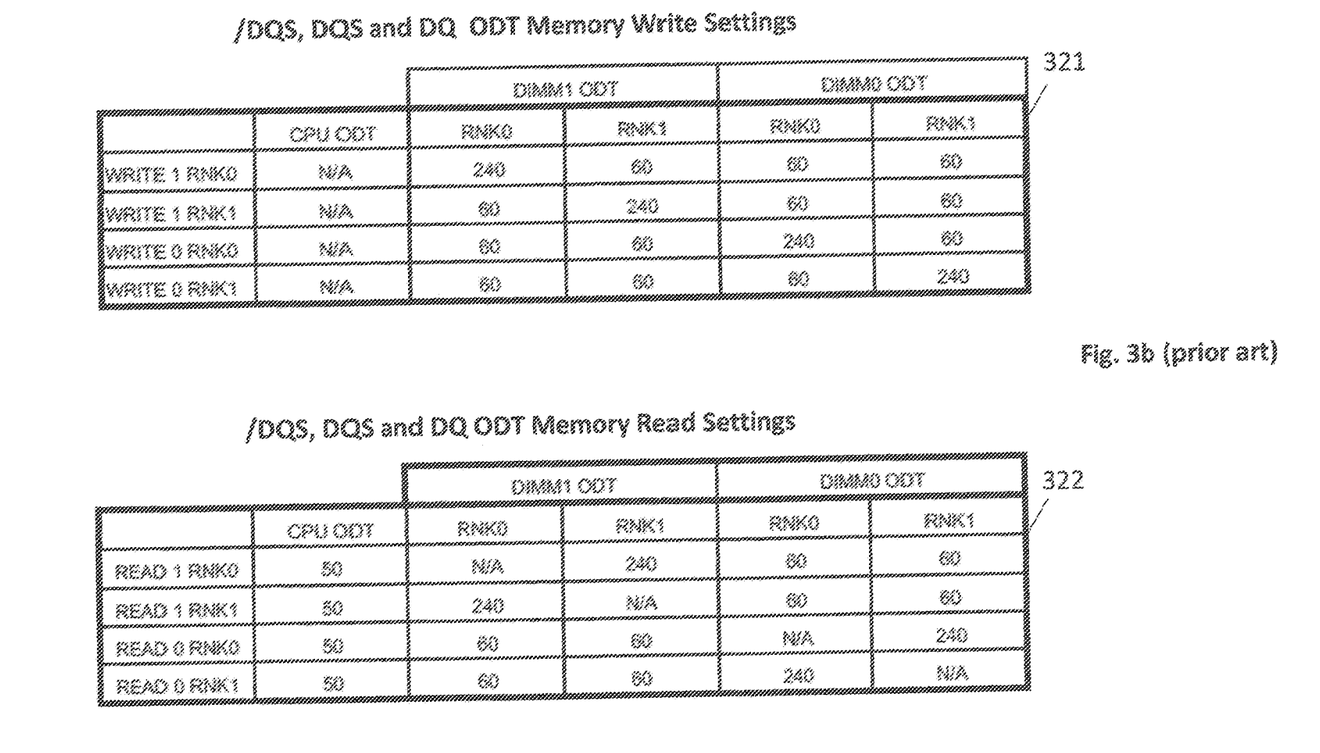

FIG. 3b shows an exemplary embodiment of the ODT settings for the DQS, /DQS and each of the DQ signal lines of a DDR memory bus. Here, during a write sequence, the ODT settings, which are tabulated in ODT matrix 321, the ODT settings for the memory controller are indeterminate, high impedance or otherwise immaterial because the memory controller is transmitting during a write sequence. By contrast, during a write sequence, the ODT settings for the memory chips of each of the ranks are set to a specific value. The value, however, depends upon whether the rank is the rank being written to or is not the rank being written to.

As can be seen from matrix 321, if a rank is the rank being written to during the write sequence, its ODT is set to 240 ohms. By contrast, if the rank is not the rank being written to, the rank's ODT is set to 60 ohms. Each row of matrix 321 corresponds to a different write target rank (the first row shows ODT settings if rank 0 of DIMM_1 is the target rank, the second row shows ODT settings if rank 1 of DIMM_1 is the target rank, etc.). In the particular embodiment of matrix 321, the signal lines of the DDR bus have a characteristic impedance that is approximately (or in the vicinity of) 50 ohms.

Additionally, as can be seen in FIG. 2a, DQS, /DQS and DQ I/Os of same positioned memory chips of different ranks on a same DIMM are coupled to same physical DQS. /DQS and DQ traces on the DIMM. That is, for instance, consider two memory chips on a same DIMM that are each to hold data bits D0 through D15 of the memory bus (but only for their respective ranks). In an implementation both chips have their respective DQS, /DQS and DQ_0 through DQ_15 signal I/Os tied to the same respective signal trace on the DIMM. For example, the DQS I/O of the first memory chip and the DQS I/O of the second memory chip are tied to a same DQS signal trace on the DIMM. So doing permits the DIMM to have only one DQS I/O that physically connects to the DQS signal of the bus, which, in turn, limits the I/O count of the DIMM thereby permitting a small form factor connection to the bus.

Thus, the ODT circuits of two memory chips that are tied to a same bus wire can be seen as being coupled in a parallel arrangement with one another. Those of ordinary skill will appreciate that, referring to matrix 321, when a 240 ohm termination resistance is coupled in parallel with a 60 ohm termination resistance, which corresponds to the setting of the write target rank ODT and the non target ODT on the same DIMM, the overall impedance of the DIMM as seen from the bus is 48 ohms (((240*60)/(240+60))=14,400/300=48). As such, the ODT settings of the pair(s) of memory chips of the targeted rank and the non targeted rank on a same DIMM are setup to diminish reflection at the DIMM/bus interface. Once the transmitted signal is received at the target DIMM with (ideally minimal) reflection from the DIMM/bus interface, the higher resistance at the target rank (240 ohm) should result in more signal energy being received at the target rank than the non targeted rank.

As such, in order to secure correct reception of signal waveforms at the target rank, the ODT values of the DQS, /DQS and DQ signals of the target rank's memory chips are set to 240 ohms. The ODT values of the DQS, /DQS and DQ signals of the memory chips of the other ranks are set to 60 ohms, e.g., not only to give the target DIMM an impedance match with the bus, but also, because a 60 ohm setting results in lowest power consumption. Here, the ranks of the DIMM that is not targeted by the write are both set to 60 ohms to, e.g., reduce the reflected signal energy of the memory chips on the non targeted DIMM (and also to ensure that the non targeted DIMM does not receive a substantial portion of the signal energy transmitted by the memory controller).

Matrix 322 shows a corresponding matrix for the read processes on the same data bus. Here, the ODT value for the DQS, /DQS and DQ signal traces that are coupled as inputs to the memory controller are set to the appropriate impedance (50 ohms). Thus, unlike the write process in which the memory controller's ODT values were not relevant, by contrast, in the case of a read in which the memory controller receives information, the memory controller's receiving end should have a specific termination resistance that is implemented by its ODT circuitry.

Referring to matrix 322, the transmitting rank during a memory read is set to an irrelevant termination resistance. Thus, if rank 0 of DIMM_0 is being read, the ODT values of the memory chips of rank 0 of DIMM_0 are set to a high impedance or otherwise irrelevant value. By contrast, the ODT values of the memory chips of rank_1 of DIMM_0 are set to 240 ohms. That is, considering the ranks on the DIMM that is targeted by the read, the ODT values of the transmitting rank are irrelevant whereas the ODT values of the non transmitting rank are set to 240 ohms. The setting of the non transmitting rank to 240 ohm, e.g., helps establish a "source" impedance of the transmitting DIMM that promotes transmission of signal energy from the transmitting rank onto the bus rather than remain within the DIMM. The memory chips of both ranks on the non targeted DIMM are set to 60 ohm to keep reflected signal energy of the non targeted DIMM low.

As discussed above, the settings described above have traditionally been implemented identically for the DQS, /DQS and DQ signal traces. That is, the settings of matrix 321 and matrix 322 of FIG. 3 have traditionally been controlling not only for the DQ traces but also the DQS and /DQS traces.

A problem is that whenever an ODT value has to change, it consumes time and the time an ODT circuit consumes changing values needs to be built into the timing budget/constraints of the memory bus. Here, as can be seen from matrix 321, the ODT value of the DQS signal will change: 1) whenever a target rank is changed during consecutive writes; 2) whenever a target rank is changed during consecutive reads and, 3) except for certain cases when the same rank and DIMM is targeted, whenever the data bus switches activity from a write to a read, or, from a read to a write (e.g., the ODT value of rank 1 of DIMM_1 does not change if the memory bus first writes to rank 1 of DIMM_1 and then reads from rank 1 of DIMM_1).

The changing of the ODT value of a DQS and/or/DQS signal can appreciably change the throughput of the overall memory bus because DQS signals, as shown in FIG. 1, are the lead signals that initiate a data transfer (the data transfer cannot happen until the differential DQS signal transitions). As such, a mechanism for improving the throughput of a data bus is to not change any DQS ODT settings, e.g., if possible.

Figure 4:
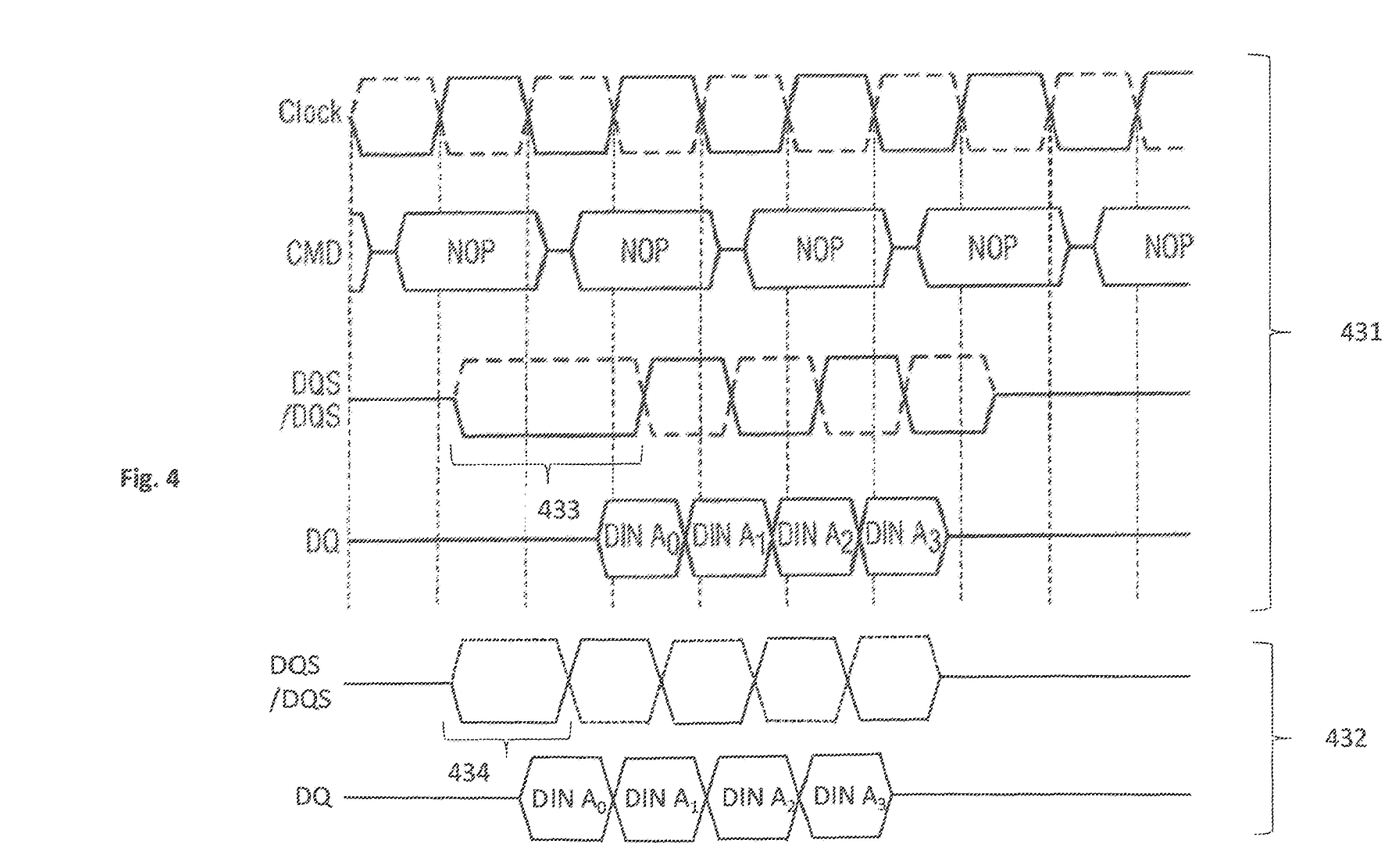
FIG. 4 shows improved DDR data bus signals.

FIG. 4 shows a comparative example of the operation of a first data bus that includes ODT changes of its DQS and /DQS signals and a second data bus that does not change ODT values for DQS and /DQS signals if possible. Specifically, timing diagram 431 essentially re-depicts FIG. 1 as a baseline example in which ODT values of the DQS and /DQS signal traces change, whereas, timing diagram 432 shows an improved DDR bus that is designed to prevent changes of ODT values of its DQS and /DQS signal traces if possible. As can be seen in the comparison of the two timing diagrams 431, 432, the first data bus 431 (ODT values of DQS and /DQS signals change) has additional time expended 433 waiting for the ODT values to change for the DQS and /DQS signal traces, whereas, the second data bus 431 has less time expended 434 prior to transmission of data because no time was wasted waiting for a DQS or/DQS signal trace to change.

More specifically, according to various JEDEC specifications, time periods 433 and 434 are referred to as the preamble and defines an amount of time that the DQS and /DQS signals must hold a steady state prior to the transmission of data on the DQ signal lines. As can be seen from FIG. 4, the preamble 433 of the first data bus is longer than the preamble 434 of the second data bus 432. That is, the first preamble 433 is approximately 2 clock cycles whereas the second preamble 434 is approximately one clock cycle. Thus, data transfers can begin approximately one clock cycle sooner with the second data bus 432 which improves the overall throughput of the data bus. Here, the one clock cycle reduction is exemplary and depicted for ease of drawing. However, modeling of potential DDR5 implementations suggest a 1-2 clock cycle reduction in preamble length by preventing ODT value changes in the DQS and /DQS signals.

In various implementations, even though the non-changing ODT values for the DQS and /DQS signal traces results in less than ideal termination values for these traces, the less than ideal ODT settings are nevertheless sufficient because the DQS and /DQS signals have an inherently higher signal-to-noise ratio because they are interpreted as a single differential signal, and, are less random than the DQ signals and therefore may not be composed with as much signal degradation as the DQ signals.

Figure 5A:
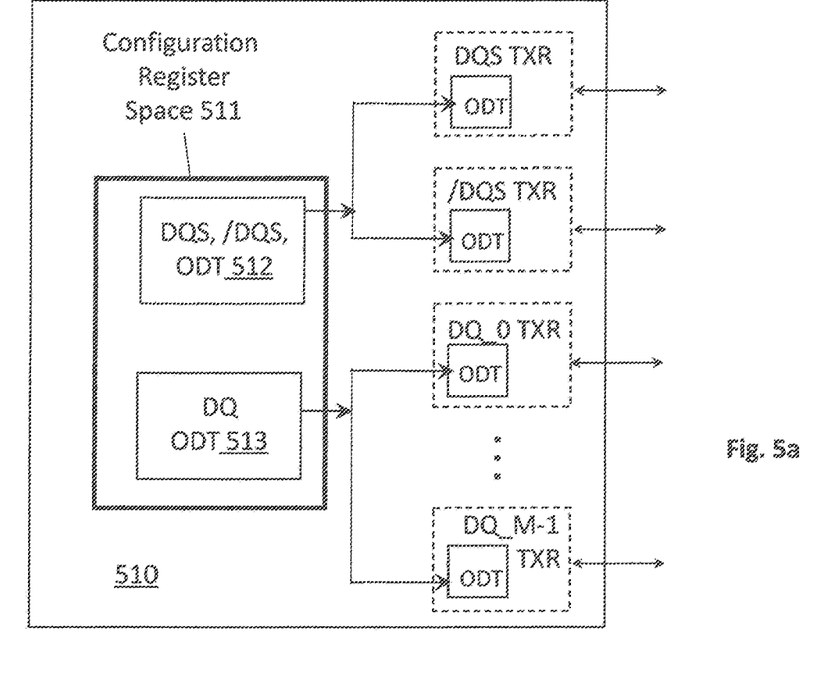
FIGS. 5a, 5b and 5c show different circuitry and ODT configuration settings of an improved DDR data bus.
Figure 5B:
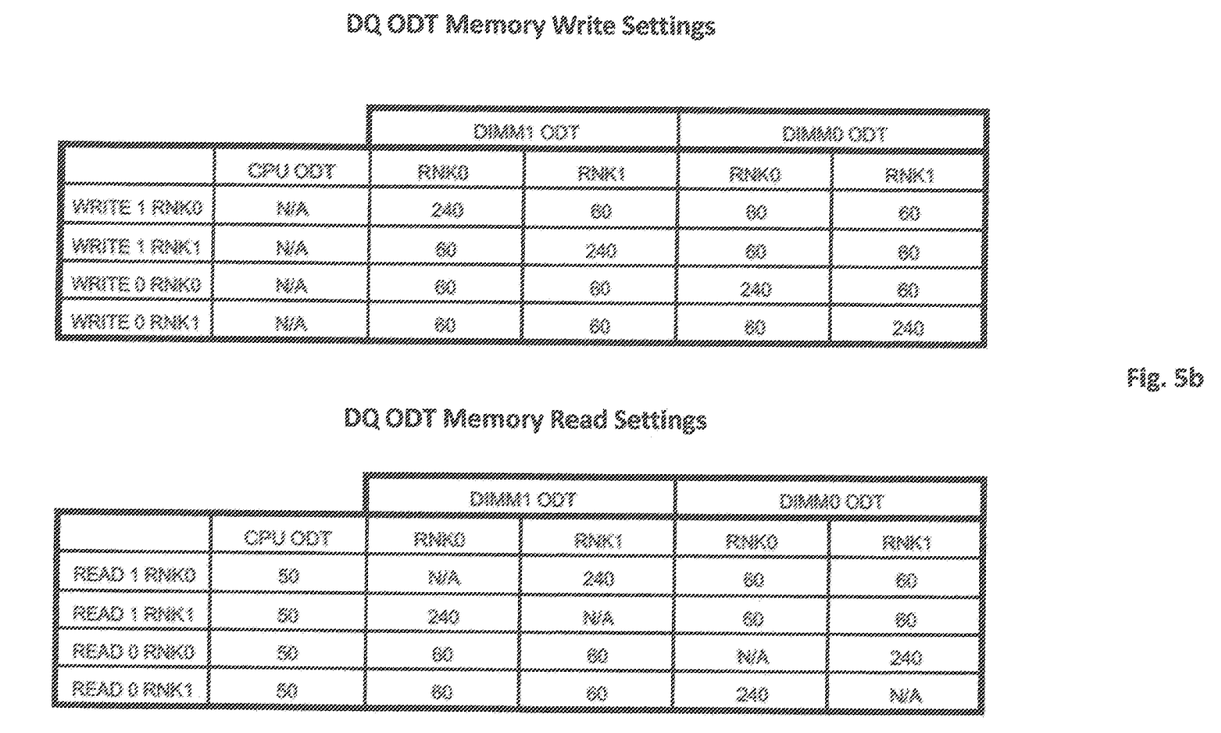
Figure 5C:
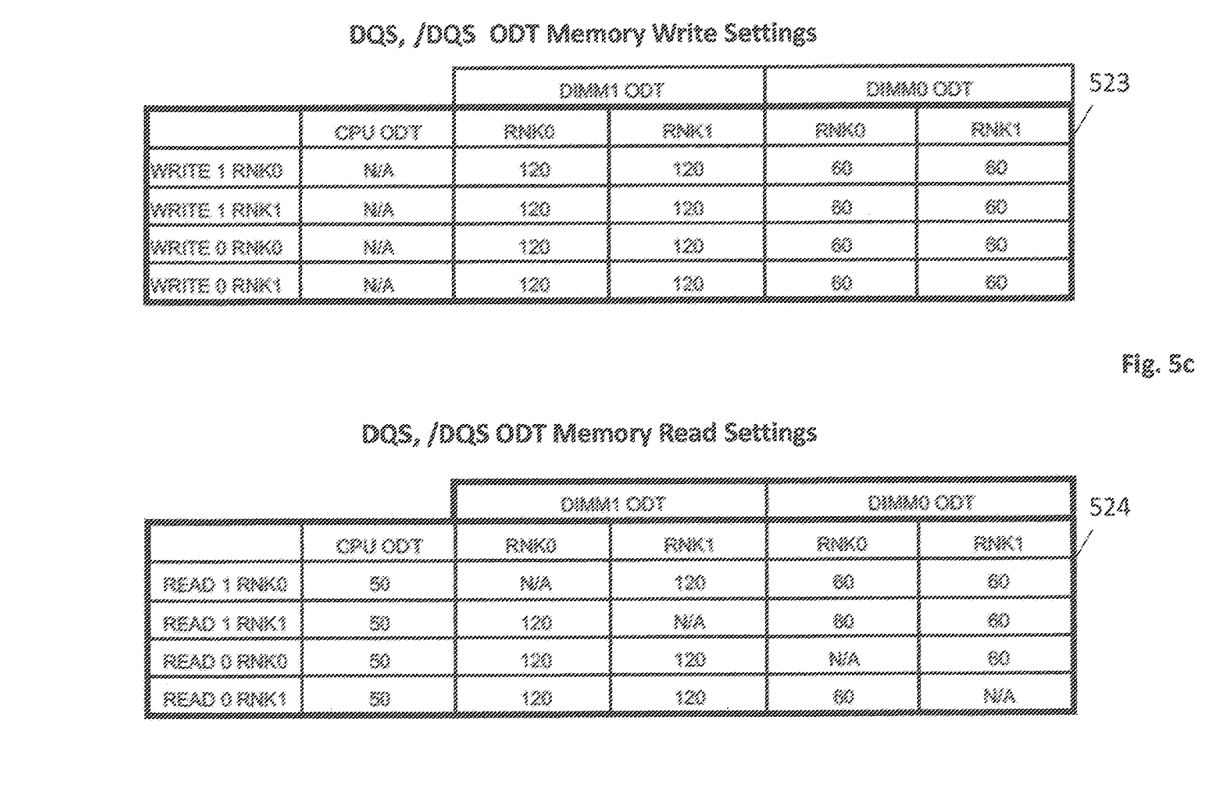

FIGS. 5*a*, 5*b* and 5*c* therefore show an improved memory system design in which the DQS and /DQS ODT configuration settings are permitted to be different than the DQ ODT configuration settings. Here, FIG. 5*a*, which can be compared directly with FIG. 3*a*, shows an improved memory controller or memory chip 510 that has separate configuration settings 512, 513 in its configuration register space 511 (a first setting 512 for DQS and /DQS ODT values and a second setting 513 for DQ ODT values). Importantly, the separate settings 512, 513 can hold different values so that a different ODT scheme can be programmed for the DQS and /DQS ODT circuits than the DQ ODT circuits. Specifically, the DQ ODT circuits are programmed to change depending on the specific changes in the operations that the memory bus is performing, whereas, the DQS and /DQS are not programmed to change at least for certain changes in the operations of the memory bus. In the case where chip 510 corresponds to a memory chip, register space 511 may be the MR register space of the memory chip.

FIGS. 5b and 5c show exemplary configuration settings. Here, FIG. 5b shows exemplary DQ ODT settings 513 which are identical to the settings discussed above with respect to FIG. 3b. By contrast, FIG. 5c shows exemplary DQS and /DQS ODT settings 512 that prevent the DQS and /DQS ODT values from changing even if specific activity of the memory bus changes. Specifically, matrix 523 shows that, for write operations, both ranks of DIMM_1 are set to 120 ohm and both ranks of DIMM_0 are set to 60 ohm irrespective of which rank and DIMM are targeted by the write. Matrix 524, which specifies ODT values of the DQS and /DQS signal traces during a read, essentially preserves the same settings as matrix 523 with the exception that the targeted rank and DIMM for a read operation are set to an immaterial value because the targeted rank and DIMM are transmitting and are not receiving.

In various embodiments, the ODT settings for both register space 511 and register space 512 are stored in system firmware (e.g., BIOS firmware) and loaded (e.g., from non volatile storage such as a FLASH memory) into the register space 511, 512 during chip boot-up and/or boot-up of the system that the DDR memory bus is integrated into.

Figure 6:
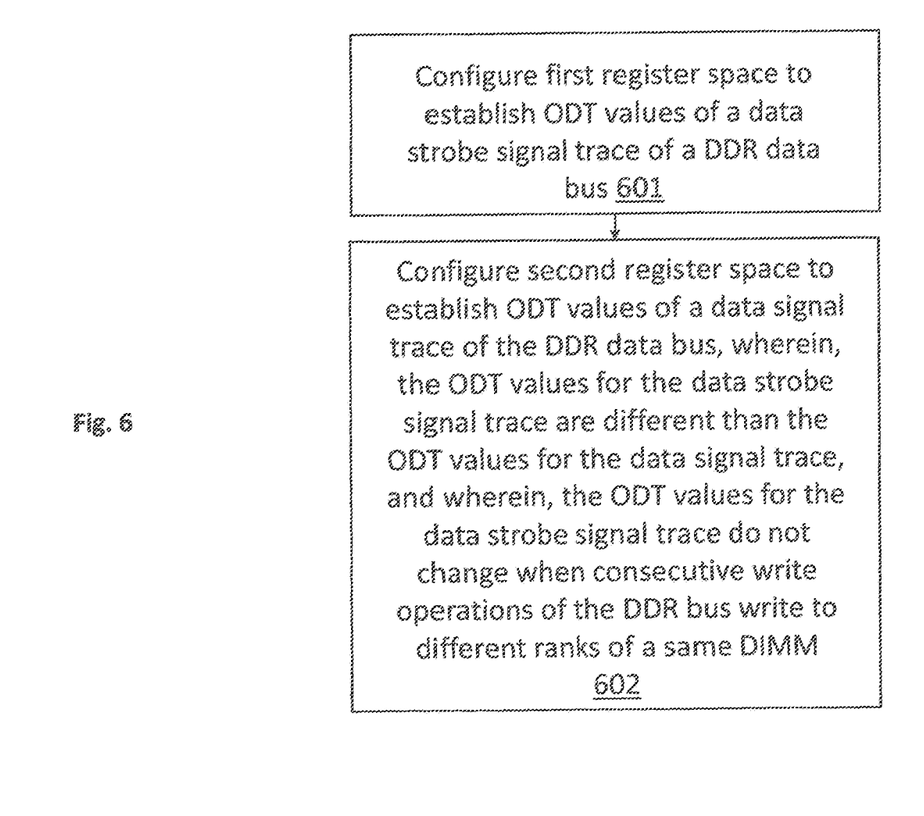
FIG. 6 shows a ODT configuration setting method.

FIG. 6 shows a method that can be performed, e.g., when configuring a memory controller or memory chip during a boot-up as described above. As observed in FIG. 6, the method includes configuring first register space to establish ODT values of a data strobe signal trace of a DDR data bus. The method also includes configuring second register space to establish ODT values of a data signal trace of the DDR data bus, wherein, the ODT values for the data strobe signal trace are different than the ODT values for the data signal trace, and wherein, the ODT values for the data strobe signal trace do not change when consecutive write operations of the DDR bus write to different ranks of a same DIMM.

Figure 7:
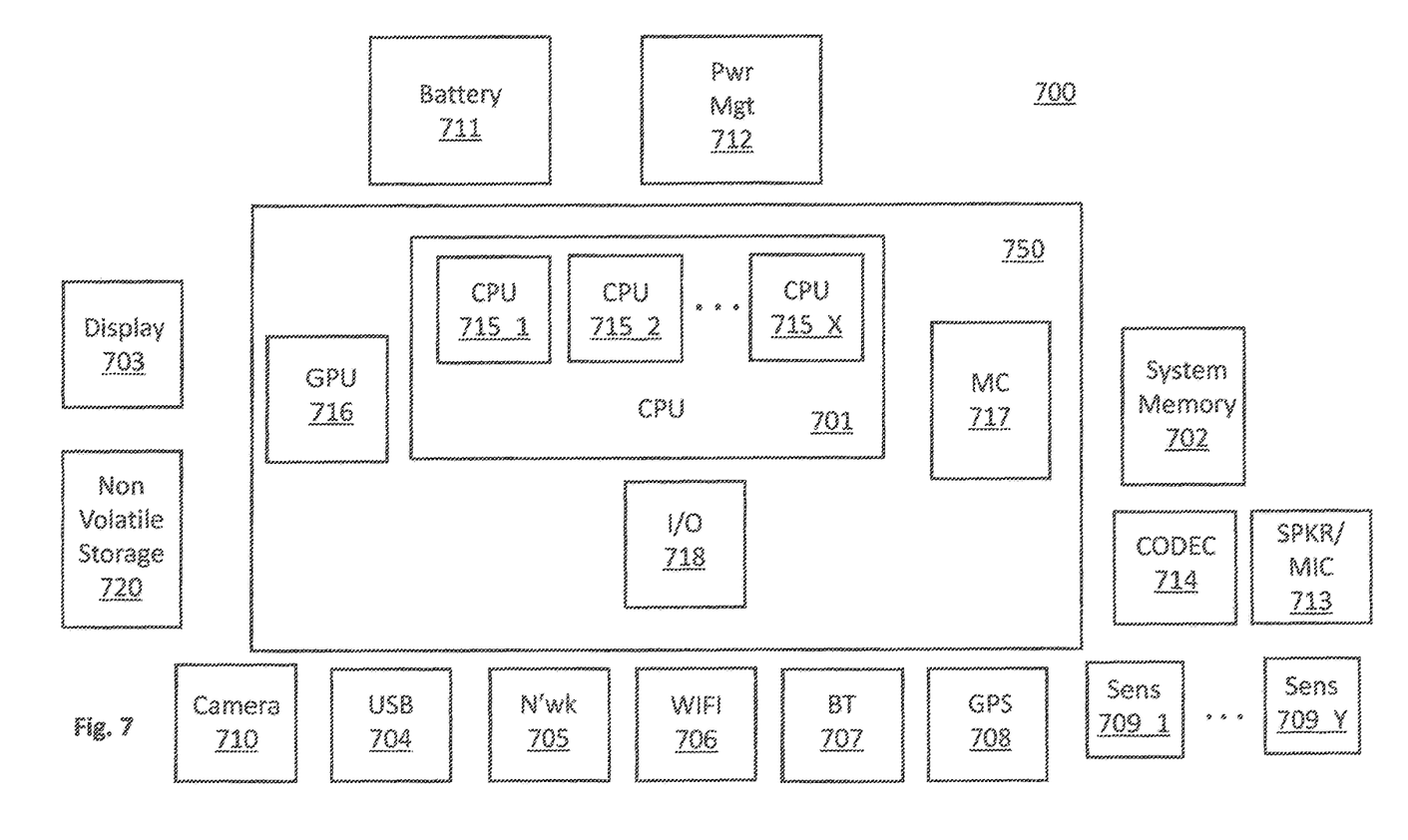
FIG. 7 shows a computing system.

FIG. 7 provides an exemplary depiction of a computing system 700 (e.g., a smartphone, a tablet computer, a laptop computer, a desktop computer, a server computer, etc.). As observed in FIG. 7, the basic computing system 700 may include a central processing unit 701 (which may include, e.g., a plurality of general purpose processing cores 715_1 through 715_X) and a main memory controller 717 disposed on a multi-core processor or applications processor, system memory 702, a display 703 (e.g., touchscreen, flat-panel), a local wired point-to-point link (e.g., USB) interface 704, various network I/O functions 705 (such as an Ethernet interface and/or cellular modem subsystem), a wireless local area network (e.g., WiFi) interface 706, a wireless point-to-point link (e.g., Bluetooth) interface 707 and a Global Positioning System interface 708, various sensors 709_1 through 709_Y, one or more cameras 710, a battery 711, a power management control unit 712, a speaker and microphone 713 and an audio coder/decoder 714.

An applications processor or multi-core processor 750 may include one or more general purpose processing cores 715 within its CPU 701, one or more graphical processing units 716, a memory management function 717 (e.g., a memory controller) and an I/O control function 718. The general purpose processing cores 715 typically execute the operating system and application software of the computing system. The graphics processing unit 716 typically executes graphics intensive functions to, e.g., generate graphics information that is presented on the display 703. The memory control function 717 interfaces with the system memory 702 to write/read data to/from system memory 702. The power management control unit 712 generally controls the power consumption of the system 700.

Each of the touchscreen display 703, the communication interfaces 704-707, the GPS interface 708, the sensors 709, the camera(s) 710, and the speaker/microphone codec 713, 714 all can be viewed as various forms of I/O (input and/or output) relative to the overall computing system including, where appropriate, an integrated peripheral device as well (e.g., the one or more cameras 710). Depending on implementation, various ones of these I/O components may be integrated on the applications processor/multi-core processor 750 or may be located off the die or outside the package of the applications processor/multi-core processor 750.

The computing system may include a memory bus, such as a DDR main memory bus that couples the system/main memory controller 717 to the system/main memory 702 where the DDR bus supports separately configurable ODT settings for its DQS, /DQS signal traces and its DQ signal traces as described at length above.

Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory chip, comprising:
   first register space to store a first on-die termination resistance value;
   second register space to store a second on-die termination resistance value;
   a first on-die termination resistance circuit to be coupled to a data strobe signal wire of a memory channel, whereupon, if a write operation is performed on the memory channel, the first on-die termination resistance circuit is to hold the data strobe signal wire's termination resistance at the first on-die termination resistance value during the write operation irrespective of whether or not the memory chip is a target of the write operation; and,
   a second on-die termination resistance circuit to be coupled to a data signal wire of the memory channel, whereupon: 1) if the memory chip is the target of the write operation, the second on-die termination resistance circuit is to select the second on-die termination resistance value for the data signal wire's termination resistance, 2) if the memory chip is not the target of the write operation, the second on-die termination resistance circuit is to not select the second on-die termination resistance value for the data signal wire's termination resistance.

2. The memory chip of claim 1 wherein the memory chip is compatible with a Joint Electron Device Engineering Council (JEDEC) engineering specification.

3. The memory chip of claim 2 wherein the data signal wire is a DQ wire and the data strobe signal wire is a DQS signal wire.

4. The memory chip of claim 2 wherein the first register space corresponds to first MR register space and the second register space corresponds to second MR register space.

5. The memory chip of claim 1 wherein the memory chip is disposed on a memory module.

6. The memory chip of claim 5 wherein the memory module is a dual in-line memory module.

7. A memory controller, comprising:
   an interface to a memory channel, the interface comprising a first transmitter to drive a data signal wire and a second transmitter to drive a data strobe signal wire, the data signal wire and the data strobe signal wire to couple to a plurality of memory chips, the first transmitter to drive the data signal wire according to first conditions comprising a change in termination resistance of whichever of the plurality of memory chips are a target of a write operation, the second transmitter to drive the data strobe signal wire according to second conditions comprising unchanged termination resistances of the plurality of memory chips irrespective of which of the plurality of the memory chips are the target of the write operation.

8. The memory controller of claim 7 wherein each memory chip of the plurality of memory chips is compatible with a Joint Electron Device Engineering Council (JEDEC) engineering specification.

9. The memory controller of claim 8 wherein the data signal wire is a DQ wire and the data strobe signal wire is a DQS signal wire.

10. The memory controller of claim 7 wherein the memory controller is disposed on a semiconductor chip comprising at least one of:
    a general purpose central processing unit; and,
    a graphics processing unit.

11. A computing system, comprising:
    a plurality of processing cores;
    a graphics processing unit;
    a network interface;
    a memory module coupled to a memory controller by way of a memory channel, the memory module comprising a memory chip, the memory chip comprising:
    first register space to store a first on-die termination resistance value;
    second register space to store a second on-die termination resistance value;
    a first on-die termination resistance circuit to be coupled to a data strobe signal wire of the memory channel, whereupon, if a write operation is performed on the memory channel, the first on-die termination resistance circuit is to hold the data strobe signal wire's termination resistance at the first on-die termination resistance value during the write operation irrespective of whether or not the memory chip is a target of the write operation; and,
    a second on-die termination resistance circuit to be coupled to a data signal wire of the memory channel, whereupon: 1) if the memory chip is the target of the write operation, the second on-die termination resistance circuit is to select the second on-die termination resistance value for the data signal wire's termination resistance, 2) if the memory chip is not the target of the write operation, the second on-die termination resistance circuit is to not select the second on-die termination resistance value for the data signal wire's termination resistance.

12. The memory chip of claim 11 wherein the memory chip is compatible with a Joint Electron Device Engineering Council (JEDEC) engineering specification.

13. The memory chip of claim 12 wherein the data signal wire is a DQ wire and the data strobe signal wire is a DQS signal wire.

14. The memory chip of claim 12 wherein the first register space corresponds to first MR register space and the second register space corresponds to second MR register space.

15. A method, comprising:
    executing a write operation on a memory channel, the memory channel comprising a plurality of memory chips coupled to a data strobe signal wire and a data signal wire, the executing of the write operation comprising:
    driving the data strobe signal wire where a first set of the plurality of memory chips that are a target of the write operation and a second set of the plurality of memory chips that are not the target of the write operation do not change their respective termination resistance of the data strobe signal wire; and,
    driving the data signal wire where the first set of the plurality of the memory chips change their respective termination resistance of the data signal wire because they are the target of the write operation.

16. The method of claim 15 wherein the memory channel is compliant with a Joint Electron Device Engineering Council (JEDEC) engineering specification.

17. The method of claim 16 wherein the data signal wire is a DQ wire and the data strobe signal wire is a DQS signal wire.

* * * * *